United States Patent
Jeong et al.

(10) Patent No.: US 9,980,373 B2
(45) Date of Patent: May 22, 2018

(54) FOLDABLE DISPLAY

(71) Applicant: Samsung Display Co., Ltd., Yongin-si, Gyeonggi-do (KR)

(72) Inventors: Chang Yong Jeong, Yongin-si (KR); Ji Won Sohn, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 256 days.

(21) Appl. No.: 15/064,446

(22) Filed: Mar. 8, 2016

(65) Prior Publication Data

US 2016/0302316 A1    Oct. 13, 2016

(30) Foreign Application Priority Data

Apr. 7, 2015   (KR) .................. 10-2015-0049136

(51) Int. Cl.
| | |
|---|---|
| H05K 1/02 | (2006.01) |
| G05B 11/01 | (2006.01) |
| G06F 1/16 | (2006.01) |
| G09F 9/30 | (2006.01) |
| H05K 5/00 | (2006.01) |
| H05K 5/02 | (2006.01) |

(52) U.S. Cl.
CPC ............. *H05K 1/028* (2013.01); *G05B 11/01* (2013.01); *G06F 1/16* (2013.01); *G09F 9/301* (2013.01); *H05K 5/0017* (2013.01); *H05K 5/0226* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,013,864 B2* | 4/2015 | Griffin | ............... | H04M 1/0216 |
| | | | | 16/382 |
| 9,119,316 B2* | 8/2015 | Lee | .......................... | H05K 7/16 |
| 9,229,481 B2* | 1/2016 | Jinbo | ..................... | G06F 1/1652 |
| 9,778,682 B2* | 10/2017 | Lee | ....................... | G06F 1/1616 |
| 2010/0164837 A1* | 7/2010 | Kao | ....................... | G06F 1/1616 |
| | | | | 345/1.3 |
| 2012/0314399 A1 | 12/2012 | Bohn et al. | | |
| 2013/0021762 A1 | 1/2013 | van Dijk et al. | | |
| 2014/0126133 A1* | 5/2014 | Griffin | ................... | G06F 1/1616 |
| | | | | 361/679.27 |
| 2015/0378397 A1* | 12/2015 | Park | ...................... | G06F 1/1652 |
| | | | | 361/679.27 |
| 2017/0013729 A1* | 1/2017 | Rothkopf | ............ | H04M 1/0216 |

FOREIGN PATENT DOCUMENTS

| | | |
|---|---|---|
| KR | 10-2010-0028343 A | 3/2010 |
| KR | 10-2013-0057029 A | 5/2013 |
| KR | 10-1292974 B1 | 7/2013 |

* cited by examiner

*Primary Examiner* — Lisa Lea Edmonds
(74) *Attorney, Agent, or Firm* — Knobbe, Martens, Olson & Bear, LLP

(57) ABSTRACT

A foldable display is disclosed. In one aspect, the foldable display includes a bendable display panel and a housing positioned at a rear side of the display panel and configuration to be folded and unfolded. The foldable display also includes a sliding unit installed between the display panel and the housing and configured to slide the display panel along the housing so as to alter a bending region of the display panel that is folded when the foldable display is folded.

20 Claims, 12 Drawing Sheets

(a)

(b)

⇐··· First direction    Second direction ···⇒

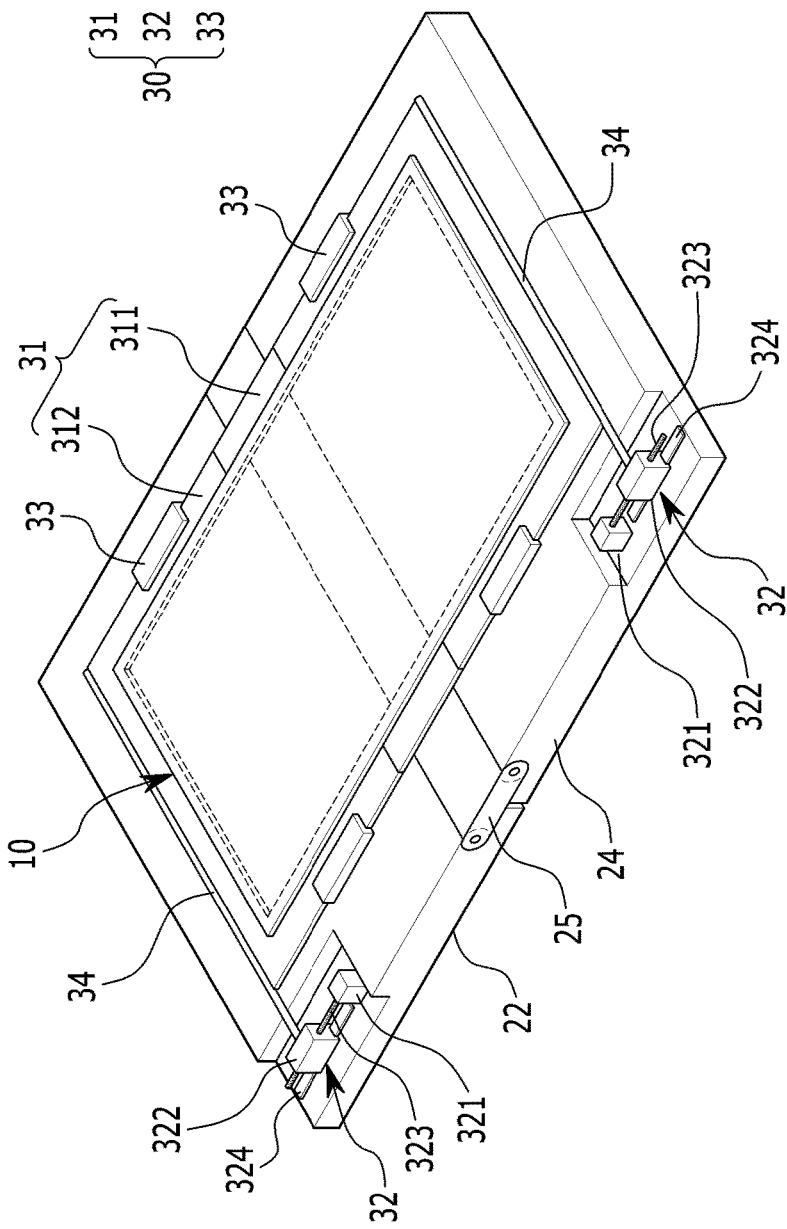

FOLDABLE DISPLAY

CROSS-REFERENCE TO RELATED APPLICATION

This application claims priority to and the benefit of Korean Patent Application No. 10-2015-0049136 filed in the Korean Intellectual Property Office on Apr. 7, 2015, the entire contents of which are incorporated herein by reference.

BACKGROUND

Field

The described technology generally relates to a foldable display.

Description of the Related Technology

Recently, flexible display panels including a display unit formed on a flexible substrate and foldable displays including such flexible display panels have been undergoing active research and development. Certain foldable displays include a flexible display panel and a housing supporting the flexible display panel in which the housing includes a hinge structure. The screen of foldable displays can be bent or can be folded in half, in thirds or in quarters.

When a foldable display is repeatedly folded and unfolded, stress is concentrated in a bending region. Accordingly, as the deformation rate of the materials in the flexible display panel exceeds their tolerance limits due to repeated folding, plastic deformation occurs. This results in a permanent deformation making it is difficult to display images without distortion in the bending region. Furthermore, the location of the bending region in the standard foldable display is fixed, resulting in accelerated deformation due to continuous fatigue being applied to the same region.

The above information disclosed in this Background section is only intended to facilitate the understanding of the background of the described technology and therefore it may contain information that does not form the prior art that is already known in this country to a person of ordinary skill in the art.

SUMMARY OF CERTAIN INVENTIVE ASPECTS

One inventive aspect is a foldable display capable of minimizing the formation of defects by preventing a permanent deformation from forming due to continuous fatigue of a bending region.

Another aspect is a foldable display including: a bendable display panel; a housing positioned at a rear side of the display panel and foldable and unfoldable; and a sliding unit installed between the display panel and the housing and changing a bending region of the display panel by sliding the display panel.

The housing can include a sensor unit sensing a folding configuration and a bending configuration. The foldable display can further include a controller electrically connected to the sensor unit and the sliding unit to control driving of the sliding unit according to a sensing signal of the sensor unit.

The sensor unit can generate a first signal in the unfolding configuration and generate a second signal in the bending configuration. The sliding unit can slide the display panel whenever the housing is bent.

The controller can control the operation of the sliding unit so that the display panel is placed at a reference position when an output signal of the sensor unit is the first signal, and divide an odd-numbered bending operation and an even-numbered bending operation by counting a second signal when the output signal of the sensor unit is the second signal.

The controller can control the operation of the sliding unit so that the display panel moves from the reference position in a first direction during the odd-numbered bending operation and control the operation of the sliding unit so that the display panel moves from the reference position in a second direction opposite to the first direction during the even-numbered bending operation.

A moving distance of the display panel in the first direction can be the same as a moving distance of the display panel in the second direction. The moving distance of the display panel in the first direction and the second direction can be constant regardless of the cumulative number of the second signal. On the other hand, the moving distance of the display panel in the first direction and the second direction can be gradually increased in proportion to an increase in the cumulative number of the second signal.

A moving distance L of the display panel in the first direction and the second direction can satisfy any one of the following conditions (1) and (2):

$$L \geq n\pi R \quad (1)$$

$$L \geq nLc \quad (2)$$

Here, n is 1 or a rational number larger than 1, $\pi$ is the mathematical constant $\pi$, R represents a minimum curvature radius which is allowable to the display panel, and Lc represents a length of an arc formed by the bending region.

On the other hand, the sensor unit can generate a third signal in the bending configuration and generate a fourth signal in the unfolding configuration. The sliding unit can slide the display panel whenever the housing is unfolded. The controller can divide an odd-numbered bending operation and an even-numbered bending operation by counting the fourth signal when the output signal of the sensor unit is the fourth signal.

The controller can control the operation of the sliding unit so that the display panel moves from the reference position in a first direction during the odd-numbered unfolding operation and control the operation of the sliding unit so that the display panel moves from the reference position in a second direction opposite to the first direction during the even-numbered unfolding operation.

A moving distance of the display panel from the reference position in the first direction can be the same as a moving distance of the display panel from the reference position in the second direction.

The moving distance of the display panel from the reference position in the first direction and the second direction can be constant regardless of the cumulative number of the fourth signal. On the other hand, the moving distance of the display panel from the reference position in the first direction and the second direction can be gradually increased in proportion to an increase in the cumulative number of the fourth signal.

A moving distance of the display panel from the reference position in the first direction and the second direction can satisfy any one of the following conditions (1) and (2):

$$L \geq n\pi R \quad (1)$$

$$L \geq nLc \quad (2)$$

Here, n is 1 or a rational number larger than 1, π is the mathematical constant π, R represents a minimum curvature radius which is allowable to the display panel, and Lc represents a length of an arc formed by the bending region.

The housing can include a first support and a second support which are coupled with each other by at least one hinge shaft and of which sides contact each other in the unfolding configuration and are spaced apart from each other. The sensor unit can be installed on at least one side of a side of the first support and a side of the second support and sense the unfolding configuration and the bending configuration of the housing by sensing whether the first support and the second support contact each other or a distance between the first support and the second support.

The sliding unit can include a support frame fixed to a rear edge of the display panel; a driver coupled with the support frame and sliding the support frame by power; and a guide unit fixed onto the housing and guiding the sliding of the support frame. The driver can include a motor and a mechanical structure converting a rotational motion of the motor into a linear motion of the support frame.

Another aspect is a foldable display including: a bendable display panel; a housing positioned at a rear side of the display panel and foldable and unfoldable; and a sliding unit installed between the display panel and the housing and sliding the display panel whenever the housing is bent or unfolded. The display panel can include a first bending region bent during odd-numbered bending and a second bending region bent during even-numbered bending.

The first bending region and the second bending region can be spaced apart from each other. A distance between the first bending region and the second bending region can be gradually increased as the bending operation number or the unfolding operation number of the housing is gradually increased.

Another aspect is a foldable display comprising a bendable display panel; a housing positioned at a rear side of the display panel and configuration to be folded and unfolded; and a sliding unit installed between the display panel and the housing and configured to slide the display panel along the housing so as to alter a bending region of the display panel that is folded when the foldable display is folded.

In exemplary embodiments, the housing comprises a sensor configured to sense whether the housing is in a folded or unfolded configuration, and wherein the foldable display further comprises a controller electrically connected to the sensor and the sliding unit and configured to control movement of the sliding unit based on a sensing signal received from the sensor.

In exemplary embodiments, the sensor is configured to generate: i) a first signal when the housing is in the unfolded configuration ii) a second signal when the housing is in the folded configuration, and the sliding unit is configured to slide the display panel along the housing in response to receiving the second signal from the sensor.

In exemplary embodiments, the controller is further configured to: i) control the operation of the sliding unit so that the display panel is placed at a reference position in response to receive the first signal from the sensor, and ii) count the number of second signals received from the sensor and control the sliding unit via an odd-numbered bending operation and an even-numbered bending operation when the number of second signals is respectively odd and even.

In exemplary embodiments, the controller is further configured to control the operation of the sliding unit so that: i) the display panel moves from the reference position in a first direction during the odd-numbered bending operation and ii) the display panel moves from the reference position in a second direction opposite to the first direction during the even-numbered bending operation.

In exemplary embodiments, a moving distance of the display panel in the first direction is equal to a moving distance of the display panel in the second direction.

In exemplary embodiments, moving distances of the display panel in the first direction and the second direction are constant regardless of the cumulative number of the second signal counted by the controller.

In exemplary embodiments, the controller is further configured to gradually increase moving distances of the display panel in the first direction and the second direction in proportion to an increase in the cumulative number of the second signal counted by the controller.

In exemplary embodiments, moving distances L of the display panel in the first direction and the second direction satisfy any one of the following conditions (1) and (2)

$$L \geq n\pi R \qquad (1)$$

$$L \geq nLc \qquad (2)$$

here, n is 1 or a rational number greater than 1, π is the mathematical constant π, R represents a minimum radius of curvature at which the display panel is bent, and Lc represents a length of an arc formed by the bending region.

In exemplary embodiments, the sensor is further configured to generate i) a third signal when the housing is in the folded configuration and ii) a fourth signal when the housing is in the unfolded configuration, and the sliding unit is further configured to slide the display panel along the housing in response to receiving the fourth signal from the sensor.

In exemplary embodiments, the controller is further configured to count the number of fourth signals received from the sensor and control the sliding unit via an odd-numbered bending operation and an even-numbered bending operation when the when the number of fourth signals is respectively odd and even.

In exemplary embodiments, the controller is further configured to control the operation of the sliding unit so that: i) the display panel moves from the reference position in a first direction during the odd-numbered unfolding operation and ii) the display panel moves from the reference position in a second direction opposite to the first direction during the even-numbered unfolding operation.

In exemplary embodiments, a moving distance of the display panel from the reference position in the first direction is equal to a moving distance of the display panel from the reference position in the second direction.

In exemplary embodiments, moving distances of the display panel from the reference position in the first direction and the second direction is constant regardless of the cumulative number of the fourth signal counted by the controller.

In exemplary embodiments, the controller is further configured to gradually increase moving distances of the display panel from the reference position in the first direction and the second direction in proportion to an increase in the cumulative number of the fourth signal counted by the controller.

In exemplary embodiments, moving distances L of the display panel from the reference position in the first direction and the second direction satisfies any one of the following conditions (1) and (2):

$$L \geq n\pi R \qquad (1)$$

$$L \geq nLc \qquad (2)$$

here, n is 1 or a rational number larger than 1, π is the mathematical constant π, R represents a minimum radius of curvature at which the display panel is bent, and Lc represents a length of an arc formed by the bending region.

In exemplary embodiments, the housing includes a first support and a second support which are connected to each other by at least one hinge shaft and wherein adjacent sides of the first and second supports contact each other in the unfolded configuration and are spaced apart from each other in the folded configuration.

In exemplary embodiments, the sensor is installed on at least one of the adjacent sides of the first and second supports and wherein the sensor is configured to sense the unfolded and folded configurations of the housing by sensing whether the first and second supports contact each other or are spaced at a predetermined distance from each other.

In exemplary embodiments, the sliding unit comprises a support frame fixed to a rear edge of the display panel; a driver coupled to the support frame and configured to slide the support frame along the housing; and a guide unit fixed to the housing and configured to guide the sliding of the support frame.

In exemplary embodiments, the driver includes a motor and a mechanical structure configured to convert rotational motion of the motor into linear motion of the support frame.

Another aspect is a foldable display, comprising a bendable display panel; a housing positioned at a rear side of the display panel and configured to be folded and unfolded; and a sliding unit installed between the display panel and the housing and configured to slide the display panel along the housing, wherein the display panel includes a first bending region configured to be bent during odd-numbered bending and a second bending region configured to be bent during even-numbered bending.

In exemplary embodiments, the sliding unit is further configured to slide the display panel whenever the housing is bent or unfolded.

In exemplary embodiments, the housing is further configured to be bent in an odd-numbered bending operation and an even-numbered bending operation, and the sliding unit is further configured to: i) move the display panel from a reference position in a first direction during the odd-numbered bending operation and ii) move the display panel from the reference position in a second direction during the even-numbered bending operation.

In exemplary embodiments, the housing is further configured to be bent in an odd-numbered unfolding operation and an even-numbered unfolding operation, and the sliding unit is further configured to: i) move the display panel from a reference position in a first direction during the odd-numbered unfolding operation and ii) move the display panel from the reference position in a second direction during the even-numbered unfolding operation.

In exemplary embodiments, the first bending region and the second bending region are spaced apart from each other.

In exemplary embodiments, the slide unit is further configured to gradually increase a distance between the first bending region and the second bending region as the bending operation number or the unfolding operation number of the housing increases.

According to at least one exemplary embodiment, since the bending region of the display panel is changed by sliding of the display panel whenever a bending operation or an unfolding operation occurs, it is possible to reduce stress accumulated in a predetermined region of the display panel. Therefore, in the foldable display of the exemplary embodiment, it is possible to prevent a permanent deformation of the display panel from forming due to accumulated fatigue and to prevent defects from occurring due to the permanent deformation by reducing the accumulated fatigue of the display panel.

BRIEF DESCRIPTION OF THE DRAWINGS

FIG. 12 is a schematic perspective view of a foldable display according to an embodiment.

DETAILED DESCRIPTION OF CERTAIN INVENTIVE EMBODIMENTS

Figure 1:
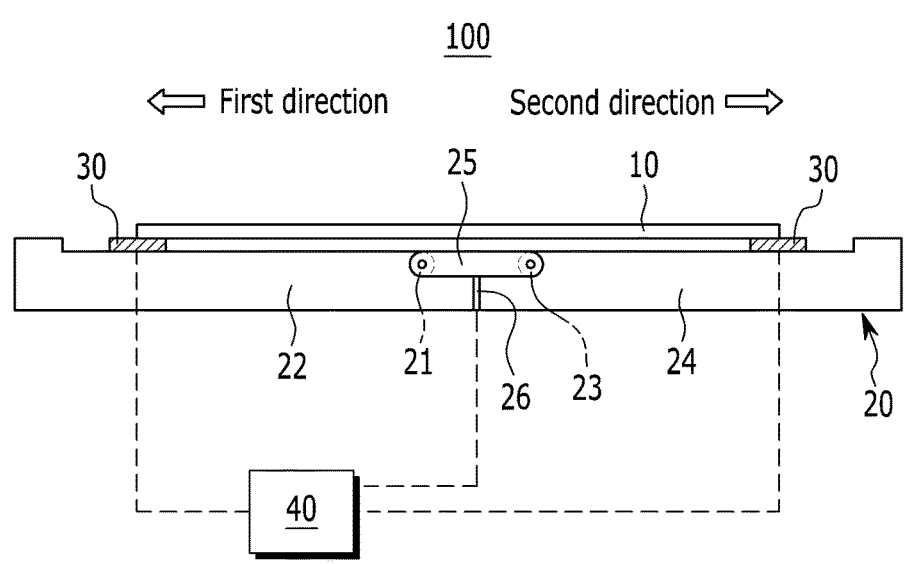
FIG. 1 is a schematic diagram illustrating a configuration in which a foldable display is unfolded according to an exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below an object, but does not essentially mean positioning on the upper side of the object based on the orientation with respect to the direction of gravity.

Throughout the specification and the claims, unless explicitly described to the contrary, the word "comprise" and variations such as "comprises" or "comprising" will be understood to imply the inclusion of the stated elements but not the exclusion of any other elements. In addition, the size and thickness of each configuration shown in the drawings are arbitrarily shown for understanding and ease of description, but the present disclosure is not limited thereto.

Figure 2:
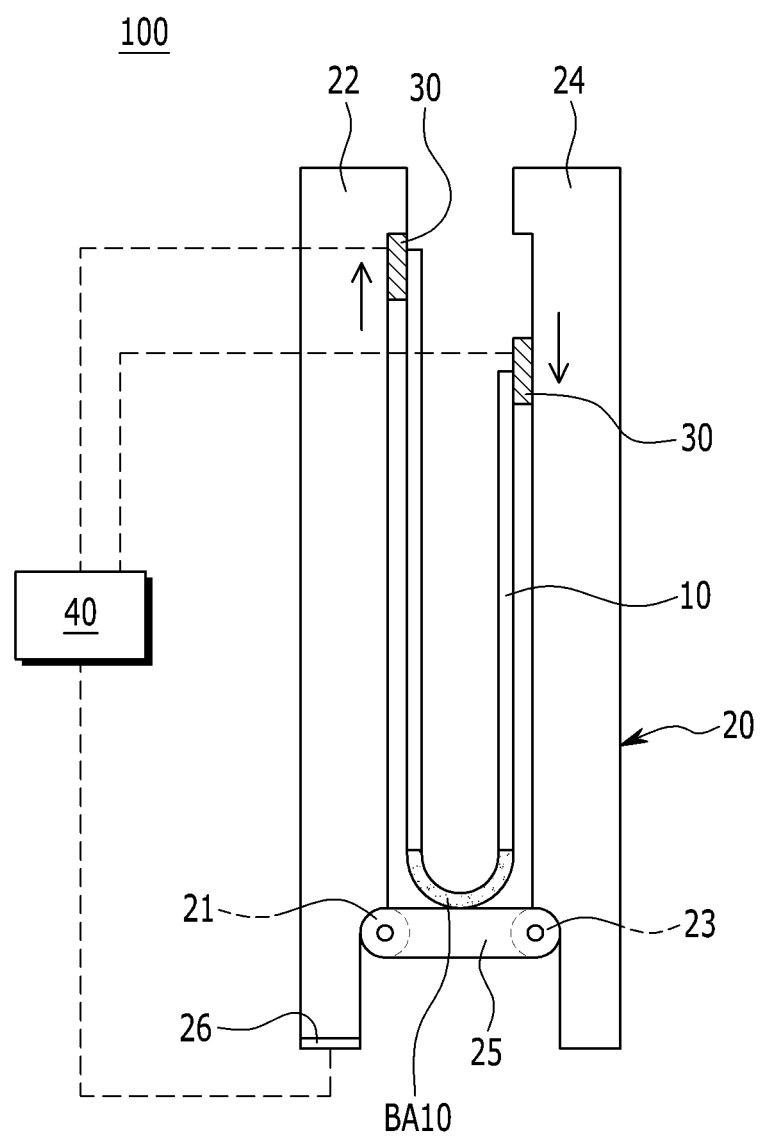
FIGS. 2 and 3 are schematic diagrams illustrating a configuration in which the foldable display is folded according to the exemplary embodiment.
Figure 3:
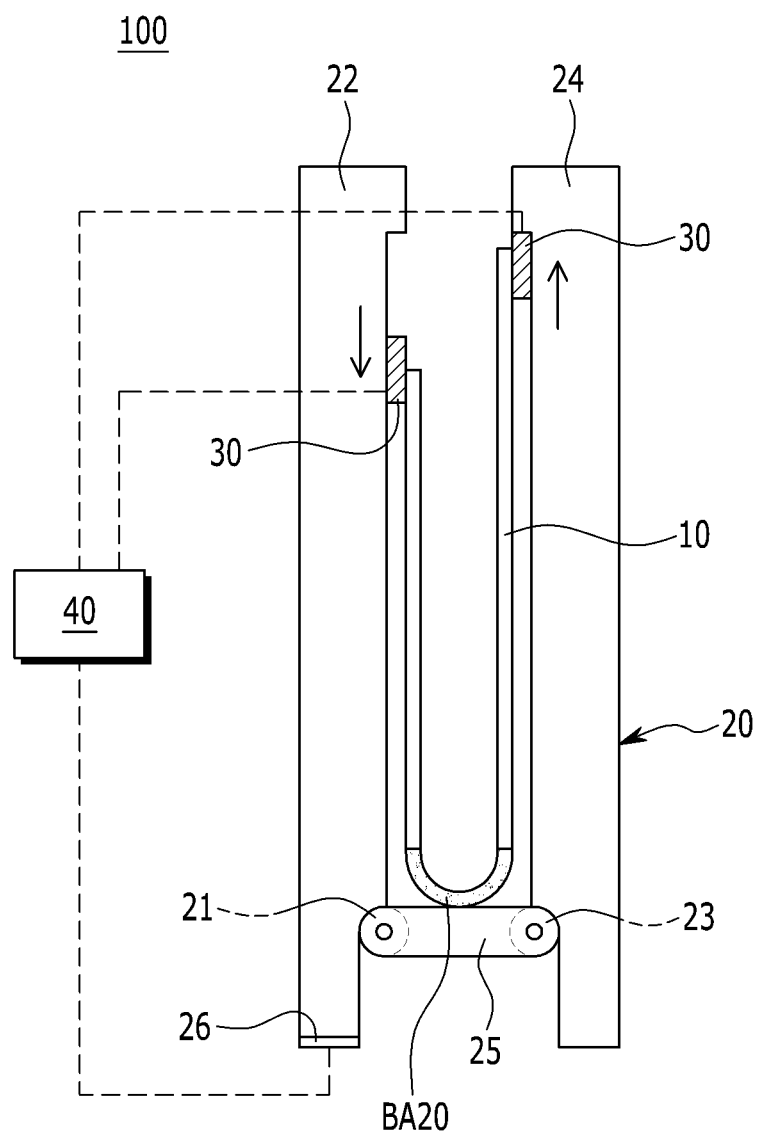

FIGS. 1 and 3 are schematic diagrams illustrating a foldable display according to an exemplary embodiment. The foldable display of FIG. 1 is in an unfolded configuration, and the foldable display of FIGS. 2 and 3 is in a configuration in which the foldable display is folded in half.

Referring to FIGS. 1 to 3, the foldable display 100 includes a bendable display panel 10, a housing 20 positioned at a rear side of the display panel 10, and a sliding unit 30 installed between the display panel 10 and the housing 20. The housing 20 can be folded and unfolded and the sliding unit 30 slides the display panel 10 whenever the display panel 10 is bent.

The display panel 10 includes a flexible substrate such as a plastic film and displays an image via a plurality of pixels arranged on the flexible substrate. The display panel 10 can be any one of an organic light-emitting diode (OLED)

display panel, a liquid crystal display (LCD) panel, and an electrophoretic display (EPD) panel. When the display panel 10 is an OLED display panel, a pixel circuit and an OLED are formed on the flexible substrate for each pixel, and a thin film encapsulation layer including a laminated structure of inorganic layers and organic layers can cover and seal the OLED.

The display panel 10 can further include a touch sensor, a polarization film, and/or a cover window. The touch sensor functions to sense touch input from a user, and the polarization film functions to increase the contrast of the screen by suppressing the reflection of external light. The cover window protects the display panel from external impact, scratches, and the like and can transmit images from the display panel 10.

The display panel 10 can further include a semiconductor chip package such as a chip-on-film and a printed circuit board. The semiconductor chip package can include a driving chip functioning as a scan driver and/or a data driver, and the printed circuit board can output a control signal for controlling the driving chip. The 'display panel 10' described in the above exemplary embodiment can include a display module including all components necessary for displaying images.

The housing 20 has a structure which can be folded and unfolded and supports the display panel 10. For example, the housing 20 can include two supports which are connected to each other by a hinge structure. FIGS. 1 to 3 illustrate an embodiment where the housing 20 includes a first support 22 having a first hinge shaft 21, a second support 24 having a second hinge shaft 23, and a connecting member or connecting rod 25 connected to both ends of the first hinge shaft 21 and the second hinge shaft 23.

The structure of the housing 20 is not limited to the illustrated example, and all structures in which the housing 20 is foldable and unfoldable while supporting the display panel 10 can be applied. In FIG. 1, the display panel 10 and the housing 20 are unfolded, and in FIGS. 2 and 3, the display panel 10 and the housing 20 are folded in half. The display panel 10 can display image(s) in the unfolded configuration, and power can be automatically turned off in the folded configuration.

The housing 20 further includes a sensor unit or sensor 26 which can sense whether the foldable display 100 is in the unfolded configuration or the unfolded configuration. The foldable display 100 further includes a controller 40 that can control the driving of the sliding unit 30 according to a sensing signal generated by the sensor unit 26. The sliding unit 30 slides the display panel 10 in a direction crossing a bending shaft of the housing 20 whenever the foldable display 100 is bent to change the bending region of the display panel 10.

For example, sides of the first support 22 and the second support 24 can contact each other in the unfolded configuration or can oppose each other at a predetermined distance. The sensor unit 26 can be installed on at least one of the side of the first support 22 and the side of the second support 24.

When the sides of the first and second supports 22 and 24 contact each other in the unfolded configuration, the sensor unit 26 can sense whether the two supports 22 and 24 contact each other. The sensor unit 26 can generate a first signal when the first support 22 and the second support 24 contact each other and generate a second signal when the first support 22 and the second support 24 are separated from each other.

When the sides of the first support 22 and the second support 24 are spaced apart from each other in the unfolded configuration, the sensor unit 26 can sense the distance between the first support 22 and the second support 24. The sensor unit 26 can generate the first signal when the sensed distance is a predetermined reference value or less and generate the second signal when the sensed distance is greater than the reference value. Any one of the first signal and the second signal can be an on signal and the other signal can be an off signal.

The sliding unit 30 is installed on the housing 20 and supports the rear surface of the display panel 10. The sliding unit 30 has a structure which reciprocally slides the display panel 10 in a direction crossing the first and second hinge shafts 21 and 23. A moving direction of the display panel 10 facing a left side based on FIG. 1 is represented as a first direction, and a moving direction of the display panel 10 facing a right side is represented as a second direction.

The moving direction and the moving distance of the display panel 10 by the sliding unit 30 can be variously controlled according to a control signal of the controller 40. A detailed mechanical configuration of the sliding unit 30 will be described below.

The controller 40 controls the operation of the sliding unit 30 according to an output signal of the sensor unit 26 to change the position of the display panel 10. In detail, the controller 40 can control the operation of the sliding unit 30 so that the display panel 10 is placed at a reference position when the output signal of the sensor unit 26 is the first signal (see FIG. 1). In addition, the controller 40 can count the number of occurrences of the second signal to record a bending number when the output signal of the sensor unit 26 is the second signal.

As the controller 40 counts the second signal, the controller 40 can control an odd-numbered bending operation and an even-numbered bending operation. When the odd-numbered bending operation occurs, the controller 40 can control the operation of the sliding unit 30 so that the display panel 10 moves from the reference position in the first direction (see FIG. 2). When the even-numbered bending operation occurs, the controller 40 can control the operation of the sliding unit 30 so that the display panel 10 moves from the reference position in the second direction (see FIG. 3).

Figure 4:
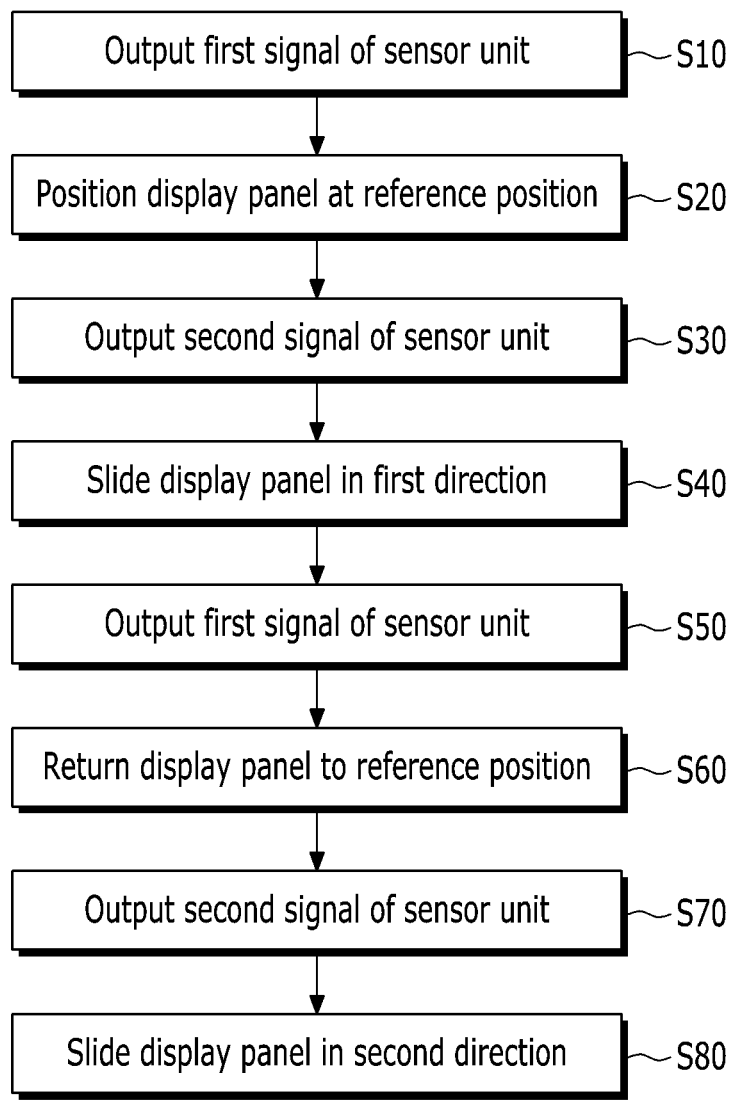
FIG. 4 is a flowchart of a method of controlling a foldable display according to an exemplary embodiment.

FIG. 4 is a flowchart of a method of controlling a foldable display according to an exemplary embodiment.

Referring to FIGS. 1 to 4, the method of controlling the foldable display 100 includes a first step (S10) in which the sensor unit 26 outputs a first signal, a second step (S20) in which the display panel 10 is positioned at a reference position by operation of the sliding unit 30, a third step (S30) in which the sensor unit 26 outputs a second signal, and a fourth step (S40) in which the display panel 10 moves from the reference position in a first direction by operation of the sliding unit 30.

Further, the operation method of the foldable display 100 includes a fifth step (S50) in which the sensor unit 26 outputs the first signal, a sixth step (S60) in which the display panel 10 is returned to the reference position by operation of the sliding unit 30, a seventh step (S70) in which the sensor unit 26 outputs the second signal, and an eighth step (S80) in which the display panel 10 moves from the reference position in a second direction by operation of the sliding unit 30.

Since the controller 40 counts the second signal to record the bending number, in the fourth step (S40), the controller 40 recognizes the second signal of the third step (S30) as an odd-numbered signal to output a moving signal in the first direction to the sliding unit 30. In the eighth step S80, the controller 40 recognizes the second signal of the seventh step (S70) as an even-numbered signal to output a moving signal in the second direction to the sliding unit 30.

The moving distance of the display panel 10 in the first direction during the odd-numbered bending operation can be the same as the moving distance of the display panel 10 in the second direction during the even-numbered bending operation. By the sliding operation of the display panel 10, during the odd-numbered bending operation, the bending region of the display panel 10 is different from the bending region of the display panel 10 during the even-numbered bending operation.

Figure 5:
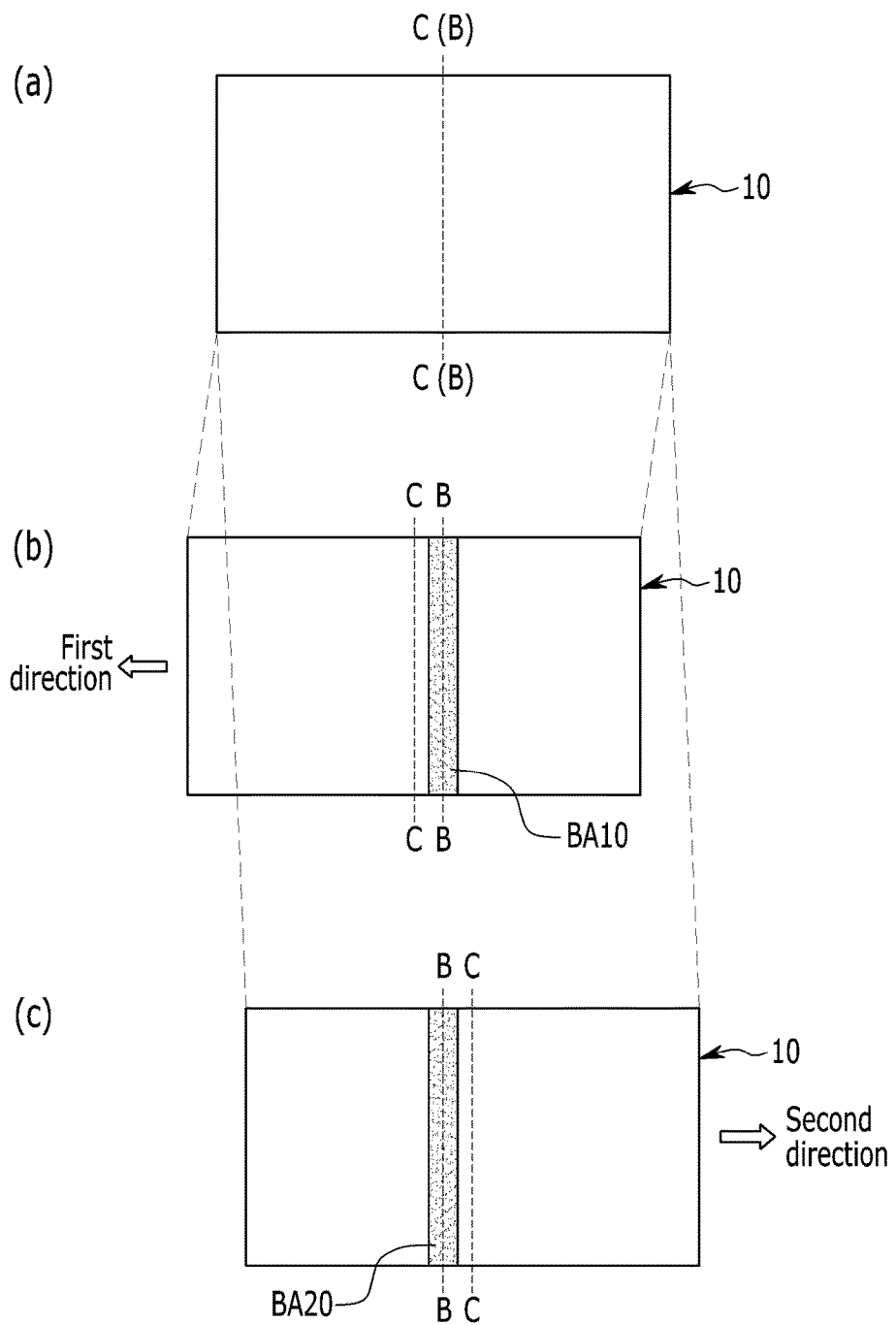
FIG. 5 is a plan view illustrating the display panel of FIGS. 1, 2, and 3, and illustrates the display panel of FIGS. 2 and 3 in an unfolded configuration.

FIG. 5 is a plan view illustrating the display panel of FIGS. 1, 2, and 3, and illustrates the display panel of FIGS. 2 and 3 in an unfolded configuration.

Referring to FIG. 5A, while the housing 20 is unfolded, the display panel 10 is placed at the reference position. The reference position can be defined as a position where a center line (a line C-C) of the display panel 10 and a bending axis (a line B-B) of the housing 20 substantially coincide with each other. Here, the bending axis (the line B-B) of the housing 20 is a virtual axis which is parallel to the two hinge shafts 21 and 23 between the first hinge shaft 21 and the second hinge shaft 23.

Referring to FIG. 5B, since the display panel 10 slides in the first direction during the odd-numbered bending operation, the center line (the line C-C) of the display panel 10 is spaced apart from the bending axis (the line B-B) of the housing 20 in the first direction. Since a bending region BA10 (a first bending region) of the display panel 10 is formed to correspond to the bending axis (the line B-B) of the housing 20, the first bending region BA10 is formed at a place which is biased in the second direction from the center line (the line C-C) of the display panel 10.

Referring to FIG. 5C, since the display panel 10 slides in the second direction during the even-numbered bending operation, the center line (the line C-C) of the display panel 10 is spaced apart from the bending axis (the line B-B) of the housing 20 in the second direction. Since a bending region BA20 (a second bending region) of the display panel 10 is formed to correspond to the bending axis (the line B-B) of the housing 20, the second bending region BA20 is formed at a place which is biased in the first direction from the center line (the line C-C) of the display panel 10.

Referring to FIGS. 1 and 5, the controller 40 can properly control the moving distance of the display panel 10 in the first direction and the second direction so that the first bending region BA10 and the second bending region BA20 do not overlap with each other. For example, the moving distance of the display panel 10 from the reference position can be equal to or greater than the width of each of the first bending region BA10 and the second bending region BA20.

Figure 6:
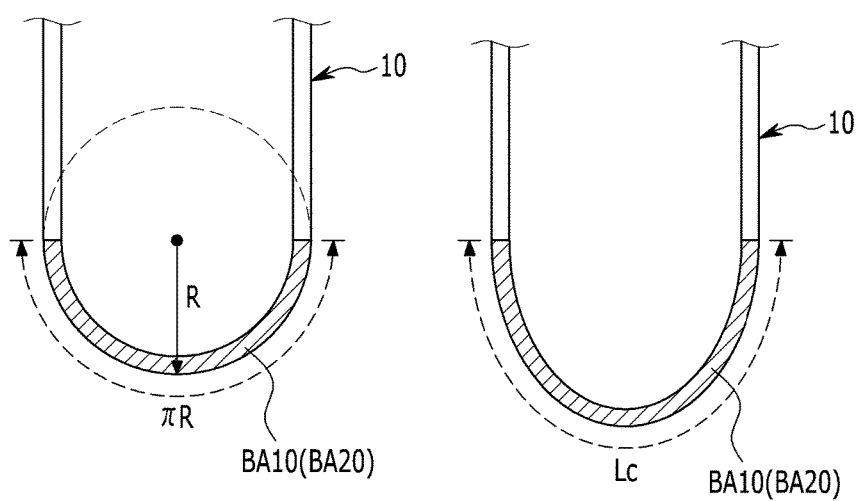
FIG. 6 is a partial enlarged view of the display panel illustrated in FIGS. 2 and 3.

The first and second bending regions BA10 and BA20 can be formed in a semi-circle or can be formed as curves other than the semi-circle, for example, an arc. FIG. 6 is a partial enlarged view of the display panel illustrated in FIGS. 2 and 3.

Referring to FIG. 6, widths of the first and second bending regions BA10 and BA20 can be formed in the semi-circular shape represented by $\pi R$. Here, $\pi$ is the mathematical constant $\pi$, and R is a radius of curvature of the first and second bending regions BA10 and BA20. The widths of the first and second bending regions BA10 and BA20 formed in shapes other than the semi-circle can be represented by Lc which is a length of the curve (i.e., a length of the arc).

The controller 40 can move the display panel 10 to a predetermined distance regardless of the cumulative number of the second signal (the repeating number of the bending operation). Accordingly, a moving distance L of the display panel 10 from the reference position can be equal to or greater than the widths ($\pi R$ or Lc) of the first and second bending regions BA10 and BA20 (i.e., L≥$\pi R$ or L≥Lc).

In other embodiments, the controller 40 can change the moving distance of the display panel 10 as the cumulative number of the second signal is increased. For example, the moving distance of the display panel 10 from the reference position can have a gradually increasing value as the cumulative number of the second signal increases. In these embodiments, the moving distance L of the display panel can be represented by n$\pi R$ or nLc. Here, n can be a natural number such as 2, 3, 4, and the like as a proportional constant having a large value in proportion to the cumulative number or a rational number greater than 1 including the numbers 1.1, 1.2, 1.3, and the like.

As a result, the moving distance L of the display panel 10 from the reference position can satisfy the following condition (1) or (2).

$$L \geq n\pi R \tag{1}$$

Here, n is 1 or a rational number greater than 1, $\pi$ is the mathematical constant $\pi$, and R is a minimum radius of curvature at which the display panel 10 can be bent. As the minimum radius of curvature at which the display panel 10 can be bent decreases, the moving distance of the display panel 10 can also decrease.

$$L \geq nLc \tag{2}$$

Here, n is 1 or a rational number greater than 1, and Lc represents a length of an arc formed by the first and second bending regions BA10 and BA2.

As such, in the exemplary embodiment, since the bending region is changed whenever the bending operation occurs by the sliding operation of the display panel 10, stress accumulated to the display panel 10 due to the bending can be largely reduced. That is, the region where the stress is generated due to the bending in the display panel 10 is increased, but an amount of stress accumulated in a predetermined portion is largely reduced.

Therefore, in the foldable display 100 according to at least one exemplary embodiment, it is possible to suppress permanent deformation of the display panel 10 due to accumulated fatigue and prevent the formation of defects due to the permanent deformation by reducing the accumulated fatigue in the predetermined portion.

Hereinabove, an embodiment where the sliding unit 30 slides the display panel 10 whenever the housing 20 is bent has been described, but on the contrary, the sliding unit 30 can slide the display panel 10 whenever the housing 20 is unfolded. FIGS. 7 to 11 are schematic diagrams for describing another method of controlling a foldable display according to an exemplary embodiment.

Figure 7:
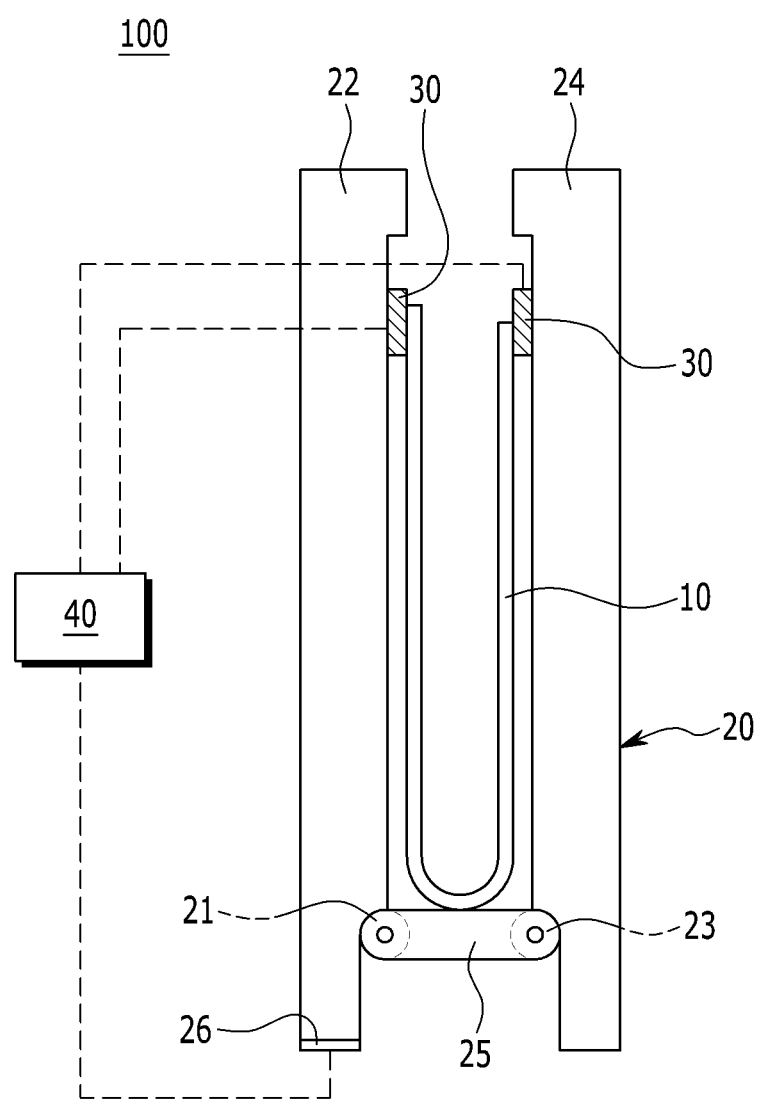
FIGS. 7 to 11 are schematic diagrams for describing another method of controlling a foldable display according to an exemplary embodiment.

Referring to FIG. 7, the foldable display 100 can have an initial configuration where the center is folded in half. Here, the initial configuration can be a configuration immediately after manufacturing of the foldable display 100.

The sensor unit 26 can sense the folded or unfolded configuration of the housing 20, and the controller 40 controls the driving of the sliding unit 30 according to a sensing signal generated by the sensor unit 26. For example, the sensor unit 26 can generate a third signal in the bent configuration and generate a fourth signal in the unfolded configuration. In addition, the controller 40 can count the fourth signal to divide an odd-numbered unfolding operation and an even-numbered unfolding operation when the output signal of the sensor unit 26 is the fourth signal.

Figure 8:
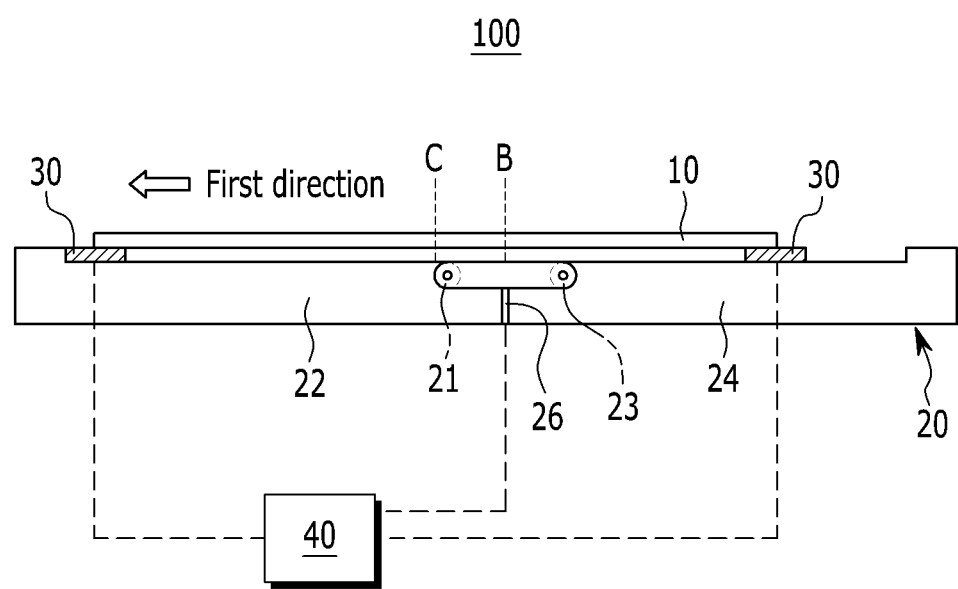

Referring to FIG. 8, during the odd-numbered unfolding operation, the controller 40 controls the operation of the sliding unit 30 so that the display panel 10 moves from the reference position in the first direction. In this embodiment, the reference position is a position where a center line C of the display panel 10 coincides with a bending axis B of the housing 20. In FIG. 8, the center line C of the display panel 10 is spaced apart from the bending axis B of the housing 20 in the first direction.

Figure 9:
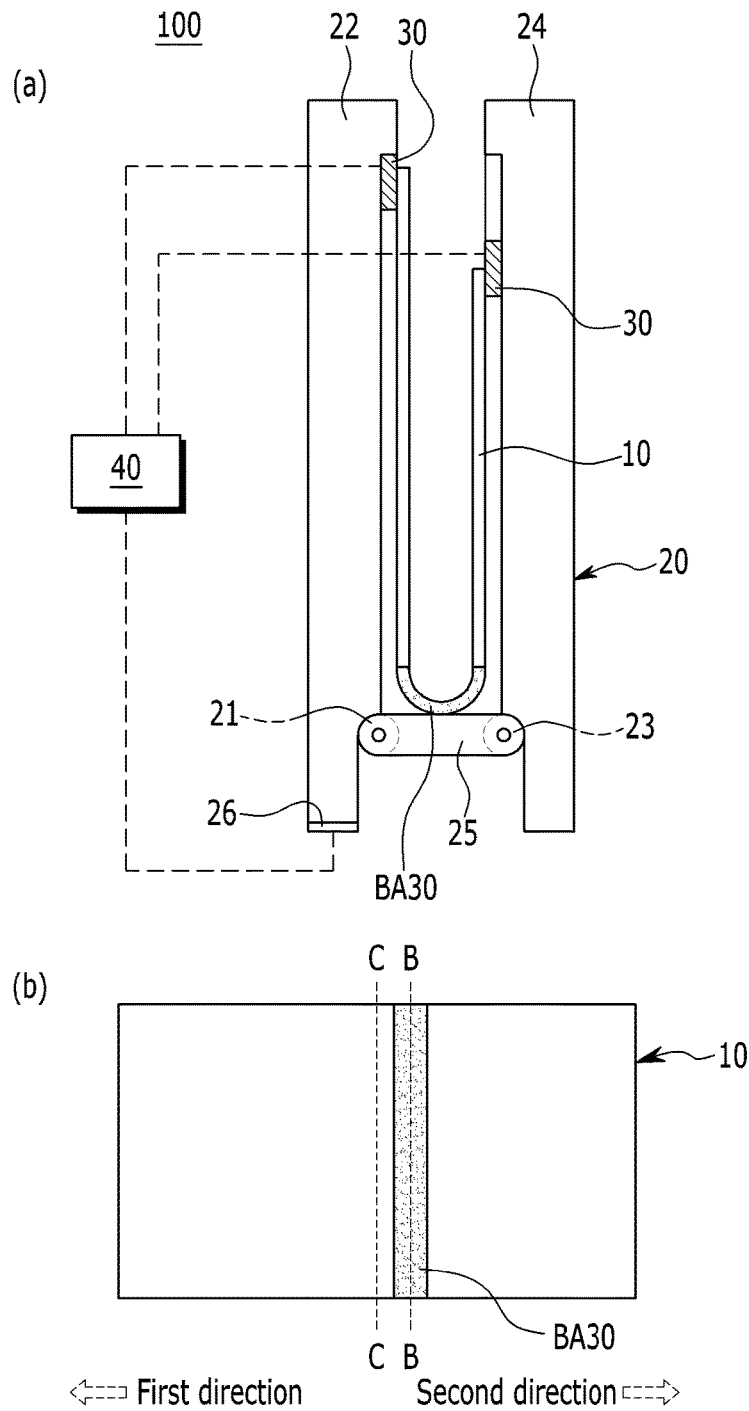

The foldable display 100 of FIG. 8 is folded in half based on the bending axis B of the housing 20 and the folded configuration is illustrated in FIG. 9. Referring to FIG. 9, since a bending region BA30 (a third bending region) of the display panel 10 is formed to correspond to the bending axis (the line B-B) of the housing 20, the third bending region BA30 is formed at a place which is biased in the second direction from the center line C-C of the display panel 10.

Figure 10:
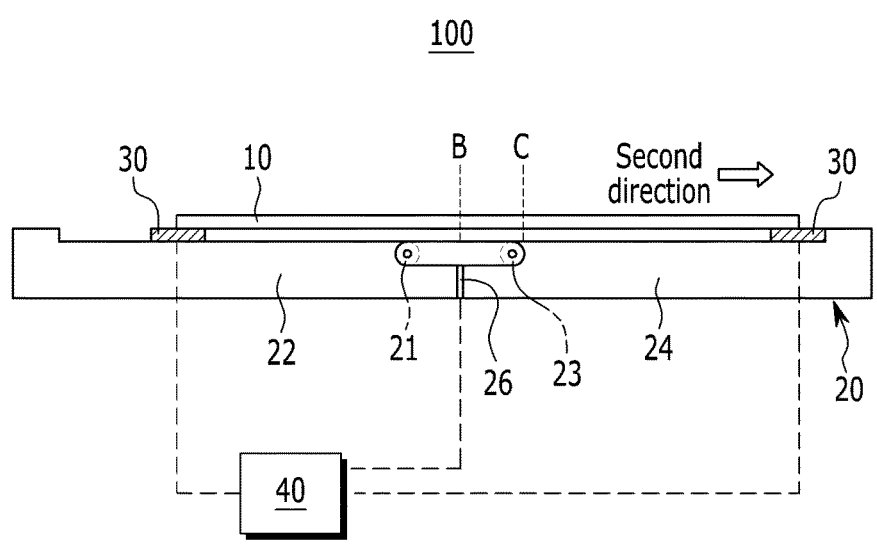

Referring to FIG. 10, during the even-numbered unfolding operation, the controller 40 controls the operation of the sliding unit 30 so that the display panel 10 moves from the reference position in the second direction. In this configuration, the center line C of the display panel 10 is spaced apart from the bending axis B of the housing 20 in the second direction.

Figure 11:
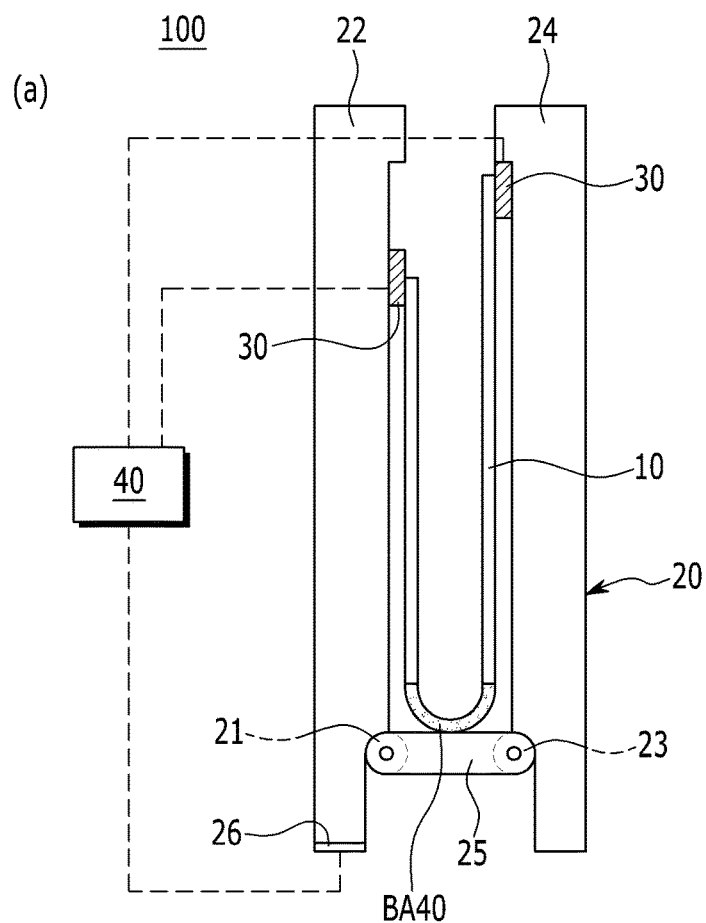
Figure 11:
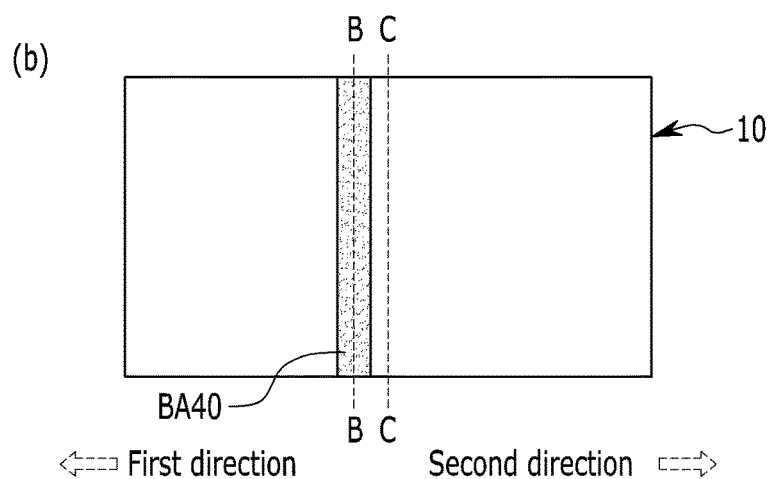

The foldable display 100 of FIG. 10 is folded in half based on the bending axis B of the housing 20 and the folded configuration is illustrated in FIG. 11. Referring to FIG. 11, since a bending region BA40 (a fourth bending region) of the display panel 20 is formed to correspond to the bending axis B-B of the housing 20, the fourth bending region BA40 is formed at a place which is biased in the first direction from the center line C-C of the display panel 10.

The moving distance of the display panel 10 from the reference position in the first direction can be the same as the moving distance of the display panel 10 from the reference position in the second direction. The moving distance of the display panel 10 from the reference position in the first direction and the second direction can be constant regardless of the cumulative number of the fourth signal or can be gradually increased in proportion to the increase in the cumulative number of the fourth signal. In the latter embodiment, the moving distance of the display panel 10 from the reference position in the first direction and the second direction can satisfy any one of the aforementioned conditions (1) and (2).

Next, the detailed structure of the sliding unit 30 will be described. The configuration of the sliding unit 30 described below is just one example and is not limited to the structure described below.

FIG. 12 is a schematic perspective view of a foldable display according to an exemplary embodiment.

Referring to FIGS. 1 and 12, the sliding unit 30 can include a support frame 31 placed on the housing 20, a driver 32 connected to the support frame 31 and sliding the support frame 31 via power applied to the driver 32, and a guide unit 33 fixed on the housing 20 and guiding movement of the support frame 31. The display panel 10 is fixed on the support frame 31.

The support frame 31 contacts a rear edge of the display panel 10 to support the display panel 10. In the support frame 31, a bending portion and a non-bending portion can be formed of different materials.

For example, in the support frame 31, a central portion 311 (a first portion) which is bent can be formed of a flexible material and the remaining portion (a second portion) which is not bent can be formed of a solid rigid material. The flexible material can include rubber, flexible plastic, or the like, and the rigid material can include metal, rigid plastic, or the like.

The driver 32 converts rotational motion of a motor 321 into a linear motion to slide the support frame. For example, the driver 32 can use a known linear motion (LM) guide structure and can be installed at both sides of the support frame 31. For example, rigid sticks 34 can be attached to opposing sides of the support frame 31, and each rigid stick 34 can be fixed to an LM block 322.

The LM blocks 322 are coupled to the motor 321 by a screw shaft 323 and the rotational motion of the screw shaft 323 is converted into linear motion of the LM block 322 by driving the motor 321. The LM block 322 moves along an LM rail 324. A moving direction and a moving distance of the LM block 322 can be controlled according to a rotational direction and a rotational number of the motor 321.

Two drivers 32 are linked with each other so that two motors 321 have the same rotational direction and the same rotational amount, i.e., the same angular rotation. Any one of the two drivers 32 can apply a pulling force to the display panel 10 and the other can apply a pushing force. The driver 32 is not limited as the aforementioned configuration, and all mechanical configurations which can convert the rotational motion into the linear motion of the support frame 31 can be applied.

Furthermore, a protective cover (not illustrated) can be installed on the display panel 10. The protective cover protects the display panel 10 from external impact such as scratching, depression, and imprinting. The protective cover slides with the display panel 10 or a position thereof can be fixed regardless of the sliding of the display panel 10.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A foldable display, comprising:
   a bendable display panel;
   a housing positioned at a rear side of the display panel and configuration to be folded and unfolded; and
   a sliding unit installed between the display panel and the housing and configured to slide the display panel along the housing so as to alter a bending region of the display panel that is folded when the foldable display is folded.

2. The foldable display of claim 1, wherein the housing comprises a sensor configured to sense whether the housing is in a folded or unfolded configuration, and wherein the foldable display further comprises:
   a controller electrically connected to the sensor and the sliding unit and configured to control movement of the sliding unit based on a sensing signal received from the sensor.

3. The foldable display of claim 2, wherein:
   the sensor is configured to generate: i) a first signal when the housing is in the unfolded configuration ii) a second signal when the housing is in the folded configuration, and
   the sliding unit is configured to slide the display panel along the housing in response to receiving the second signal from the sensor.

4. The foldable display of claim 3, wherein the controller is further configured to: i) control the operation of the sliding unit so that the display panel is placed at a reference position in response to receive the first signal from the sensor, and ii) count the number of second signals received from the sensor and control the sliding unit via an odd-numbered bending operation and an even-numbered bending operation when the number of second signals is respectively odd and even.

5. The foldable display of claim 4, wherein the controller is further configured to control the operation of the sliding unit so that: i) the display panel moves from the reference position in a first direction during the odd-numbered bending operation and ii) the display panel moves from the reference position in a second direction opposite to the first direction during the even-numbered bending operation.

6. The foldable display of claim 5, wherein a moving distance of the display panel in the first direction is equal to a moving distance of the display panel in the second direction.

7. The foldable display of claim 5, wherein moving distances of the display panel in the first direction and the second direction are constant regardless of the cumulative number of the second signal counted by the controller.

8. The foldable display of claim 5, wherein the controller is further configured to gradually increase moving distances of the display panel in the first direction and the second direction in proportion to an increase in the cumulative number of the second signal counted by the controller.

9. The foldable display of claim 5, wherein moving distances L of the display panel in the first direction and the second direction satisfy any one of the following conditions (1) and (2):

$$L \geq n\pi R \quad (1)$$

$$L \geq nLc \quad (2)$$

here, n is 1 or a rational number greater than 1, $\pi$ is the mathematical constant $\pi$, R represents a minimum radius of curvature at which the display panel is bent, and Lc represents a length of an arc formed by the bending region.

10. The foldable display of claim 2, wherein:
the sensor is further configured to generate i) a third signal when the housing is in the folded configuration and ii) a fourth signal when the housing is in the unfolded configuration, and
the sliding unit is further configured to slide the display panel along the housing in response to receiving the fourth signal from the sensor.

11. The foldable display of claim 10, wherein the controller is further configured to count the number of fourth signals received from the sensor and control the sliding unit via an odd-numbered bending operation and an even-numbered bending operation when the when the number of fourth signals is respectively odd and even.

12. The foldable display of claim 11, wherein the controller is further configured to control the operation of the sliding unit so that: i) the display panel moves from the reference position in a first direction during the odd-numbered unfolding operation and ii) the display panel moves from the reference position in a second direction opposite to the first direction during the even-numbered unfolding operation.

13. The foldable display of claim 12, wherein a moving distance of the display panel from the reference position in the first direction is equal to a moving distance of the display panel from the reference position in the second direction.

14. The foldable display of claim 12, wherein moving distances of the display panel from the reference position in the first direction and the second direction is constant regardless of the cumulative number of the fourth signal counted by the controller.

15. The foldable display of claim 12, wherein the controller is further configured to gradually increase moving distances of the display panel from the reference position in the first direction and the second direction in proportion to an increase in the cumulative number of the fourth signal counted by the controller.

16. The foldable display of claim 12, wherein moving distances L of the display panel from the reference position in the first direction and the second direction satisfies any one of the following conditions (1) and (2):

$$L \geq n\pi R \quad (1)$$

$$L \geq nLc \quad (2)$$

here, n is 1 or a rational number larger than 1, $\pi$ is the mathematical constant $\pi$, R represents a minimum radius of curvature at which the display panel is bent, and Lc represents a length of an arc formed by the bending region.

17. The foldable display of claim 2, wherein:
the housing includes a first support and a second support that are connected to each other by at least one hinge shaft and wherein adjacent sides of the first and second supports contact each other in the unfolded configuration and are spaced apart from each other in the folded configuration, and
the sensor is installed on at least one of the adjacent sides of the first and second supports and wherein the sensor is configured to sense the unfolded and folded configuration of the housing by sensing whether the first and second supports contact each other or are spaced at a predetermined distance from each other.

18. The foldable display of claim 1, wherein:
the sliding unit comprises a support frame fixed to a rear edge of the display panel, a driver coupled to the support frame and configured to slide the support frame along the housing, and a guide unit fixed to the housing and configured to guide the sliding of the support frame, and
the driver includes a motor and a mechanical structure configured to convert rotational motion of the motor into linear motion of the support frame.

19. A foldable display, comprising:
a bendable display panel;
a housing positioned at a rear side of the display panel and configured to be folded and unfolded; and
a sliding unit installed between the display panel and the housing and configured to slide the display panel along the housing,
wherein the display panel includes a first bending region configured to be bent during odd-numbered bending and a second bending region configured to be bent during even-numbered bending.

20. The foldable display of claim 19, wherein the sliding unit is further configured to slide the display panel whenever the housing is bent or unfolded.

* * * * *